United States Patent
Gupta et al.

(10) Patent No.: US 7,336,213 B2
(45) Date of Patent: Feb. 26, 2008

(54) POLARITY INDEPENDENT PRECISION MEASUREMENT OF AN INPUT VOLTAGE SIGNAL

(75) Inventors: Nikhil Gupta, Bulandshahr (IN); Alok K. Mittal, Vihar (IN)

(73) Assignee: STMicroelectronics Pvt. Ltd., Noida (IN)

( * ) Notice: Subject to any disclaimer, the term of this patent is extended or adjusted under 35 U.S.C. 154(b) by 0 days.

(21) Appl. No.: 11/305,328

(22) Filed: Dec. 16, 2005

(65) Prior Publication Data

US 2006/0145909 A1  Jul. 6, 2006

(30) Foreign Application Priority Data

Dec. 17, 2004  (IN)  .................. 2516/DEL/2004

(51) Int. Cl.
*H03M 1/50* (2006.01)
(52) U.S. Cl. ...................... 341/166; 341/167
(58) Field of Classification Search ................ 341/166, 341/167, 141, 126
See application file for complete search history.

(56) References Cited

U.S. PATENT DOCUMENTS 4,254,406 A * 3/1981 Meares ........................ 341/157
4,649,372 A * 3/1987 Abe et al. .................... 341/136
4,731,602 A * 3/1988 Hata ........................... 341/166
5,182,561 A * 1/1993 Sasaki ......................... 341/166
5,184,128 A * 2/1993 Snow .......................... 341/128
6,693,577 B2 * 2/2004 Yamamoto .................. 341/155
7,038,610 B2 * 5/2006 Yamamoto et al. ......... 341/167

* cited by examiner

*Primary Examiner*—Rexford Barnie
*Assistant Examiner*—Joseph Lauture
(74) *Attorney, Agent, or Firm*—Gardere Wynne Sewell LLP

(57) ABSTRACT

Polarity independent precision measurement of an input voltage signal is accomplished using a voltage integrating circuit that receives a first positive reference voltage and the input voltage signal, wherein the first positive reference voltage is greater in magnitude than the input voltage signal. A resetting circuit is coupled to the voltage integrating circuit for stabilizing its output. A pair of comparators, each connected to the output of the voltage integrating circuit, make voltage comparisons against a second reference voltage and a third reference voltage respectively, wherein the second and third reference voltages are greater in magnitude than the first reference voltage. A time interval measurement circuit receives the outputs of the pair of comparators, and operates to measure the time taken for the output of the voltage integrating circuit to transit to the second reference voltage level and the third reference voltage level. The time interval measurement circuit provides an output for controlling the resetting circuit.

20 Claims, 6 Drawing Sheets

POLARITY INDEPENDENT PRECISION MEASUREMENT OF AN INPUT VOLTAGE SIGNAL

PRIORITY CLAIM

The present application claims priority from Indian Patent Application No. 2516/Del/2004 filed Dec. 17, 2004, the disclosure of which is hereby incorporated by reference.

BACKGROUND OF THE INVENTION

1. Technical Field of the Invention

The present invention relates to precision measurement of polarity independent input signal by using a positive reference voltage.

2. Description of Related Art

Semiconductor applications that involve voltage specific battery management circuits critically rely on explicit measurement of an input signal and its polarity for enabling the battery charging/discharging and monitoring operation.

Precision measurement of the input signal is herein discussed with reference to the conversion of the analog voltage signal to a digital value. In an embedded system such as would include a microcontroller, an Analog-to-Digital Converter (ADC) is required to be interfaced to analog voltage sources (wherein said sources generates signals of positive and negative polarity). Conventional microcontrollers have a Successive Approximation Register (SAR) technique ADC, which does not have the capability to measure the negative voltages using a positive voltage reference. Further, the embedded ADCs do not have high resolution> It therefore becomes essential to provide an external circuit capable of measuring voltages with higher precision for both polarities of signals.

Conventional slope converters have the capability of measuring both positive and negative input signals, which requires a dual supply for measuring positive and negative input voltages. Applications based on microcontrollers, however, cannot feasibly incorporate such a dual supply.

An existing method of measuring the negative and positive voltage signals is described in U.S. Pat. No. 5,184,128, the disclosure of which is hereby incorporated by reference, which teaches an Integrating A/D converter. Herein, the input voltage polarity is first detected and is then converted to a predetermined polarity so as to have a single polarity conversion by the integral amplifier. Detection and conversion to a homogeneous polarity signal involves complex hardware incorporation in the above-described document.

Another existing polarity detection and measurement circuit is a Sigma-Delta converter, which measures differential input voltages, can also be used for measuring both positive and negative voltages. In microcontroller applications where memory size is critical, the complex digital part of sigma-delta converter is a costly solution in terms of memory size usage.

Conventional slope converters (single and dual slope ADCs) use different configurations for positive and negative input voltage signals, which are selected by using analog switches. Consequently the signals charge the capacitor in the same direction for positive and negative voltage in the same direction of polarity. However, the analog switches are not cost effective as regard to the hardware used in the polarity detection and measurement equipment.

Thus, there exists a need for an apparatus for high precision measurement of a voltage signal that does not depend on the polarity of said voltage signal. Preferably, such an apparatus would be capable of measuring the voltage signal independent of variations in the polarity. Additionally, it would be preferred if the apparatus could measure the time taken for the output signal to transit between a first level reference voltage and a second level reference voltage.

SUMMARY OF THE INVENTION

In accordance with an embodiment of the present invention, an apparatus for polarity independent precision measurement of an input voltage signal comprises a voltage integrating means for receiving a first positive reference voltage at its first input. This means is connected at its second input to said input voltage signal through a connecting means. The first positive reference voltage is greater in magnitude than said input voltage signal. The apparatus further comprises a resetting means coupled to said voltage integrating means for stabilizing the output of said voltage integrating means. A pair of comparators are included, wherein each comparator has a first input terminal connected to the output of said voltage integrating means and a second input terminal connected to a second reference voltage and a third reference voltage respectively. Said second and third reference voltages are greater in magnitude than said first reference voltage. The apparatus further comprises a time interval measurement means having its two inputs connected to the outputs of said pair of comparators for measuring the time taken for the output of said voltage integrating means to transit between said second reference voltage level and said third reference voltage level. Said time interval measurement means also provides complementary outputs for controlling said connecting means and for controlling said resetting means.

In another embodiment, the present invention provides a method for polarity independent precision measurement of input voltage signal comprising integrating said input voltage signal to a first reference voltage and resetting the integrated output voltage to a value equal to said first reference voltage. Said integrated output voltage is integrated to a second reference voltage and then to a third reference voltage. The integrated output voltage is compared with said second and third reference voltages. The integration of the input voltage signal is controlled and the integrated output voltage is reset. The time taken for the integration output to attain the value equal to said second and third reference voltage is measured.

Conventional slope converters require a dual supply to do the conversion of positive and negative voltages. In applications based on a microcontroller, such a dual supply is not available. Thus, an aspect of the instant invention obviates the need for a dual reference supply for voltage measurement and provides a solution to measure both positive and negative voltages using positive supply reference.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

An embodiment of the apparatus in the instant invention comprises an OPAMP integrating amplifier circuit coupled to MOS switches and a method to interpret the hardware signals using the timers and do the voltage to time conversion, wherein the method is embedded in a computing system.

Figure 1:
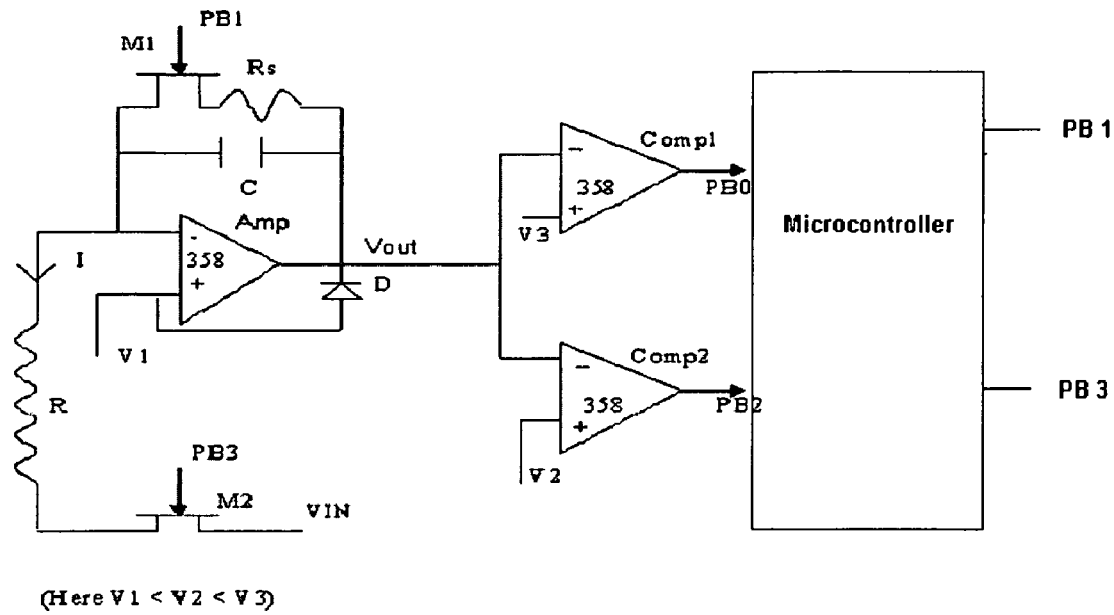
FIG. 1 illustrates the apparatus for precision measurement of a polarity independent voltage signal in accordance with an embodiment of the invention.

FIG. 1 illustrates the components used in an embodiment of the apparatus of the instant invention. The figure illustrates an integrating capacitor C, resistor Rs, external opamp Amp, and comparators (Comp 1 & Comp 2) coupled to the I/O pins (PB0 & PB2) of a microcontroller (for example, the ST72F264 microcontroller from STMicroelectronics which is used in a preferred implementation of the instant embodiment). As shown in the diagram, a current I, flowing through the resistor R, charges the capacitor C in the positive direction and the output starts increasing from an initial value V1. Input capture pins PB0 and PB2 of the microcontroller are used to measure the time in which Vout charges from V1 to V2 and from V1 to V3, respectively. Herein, the difference of a reference signal and input signal (V1−VIN) is inversely proportional to the time measured for the output voltage Vout to reach to higher positive reference voltage levels.

The gate signals of the switches M1 and M2 are controlled by the I/O pins PB1 and PB3, respectively, of the microcontroller, wherein said pins are control pins of the OPAMP circuit and are fed to the ports of the microcontroller. The output of each comparator is connected to one of the input capture pins PB0 and PB2 of the microcontroller in order to detect the falling edge when Vout becomes equal to V2 and V3, respectively.

Voltage to Time conversion by using the OPAMP circuit is described as follows. Initially, the capacitor is held in the reset state by switching on transistor M1 and switching off transistor M2. Voltage Vout first attains a value equal to V1 volts. Charging of the capacitor C is enabled by switching off M1 and switching on M2. For the input value VIN≦V1, the current I is in the direction as shown in the figure and the output starts increasing in the direction of positive polarity.

Figure 2:
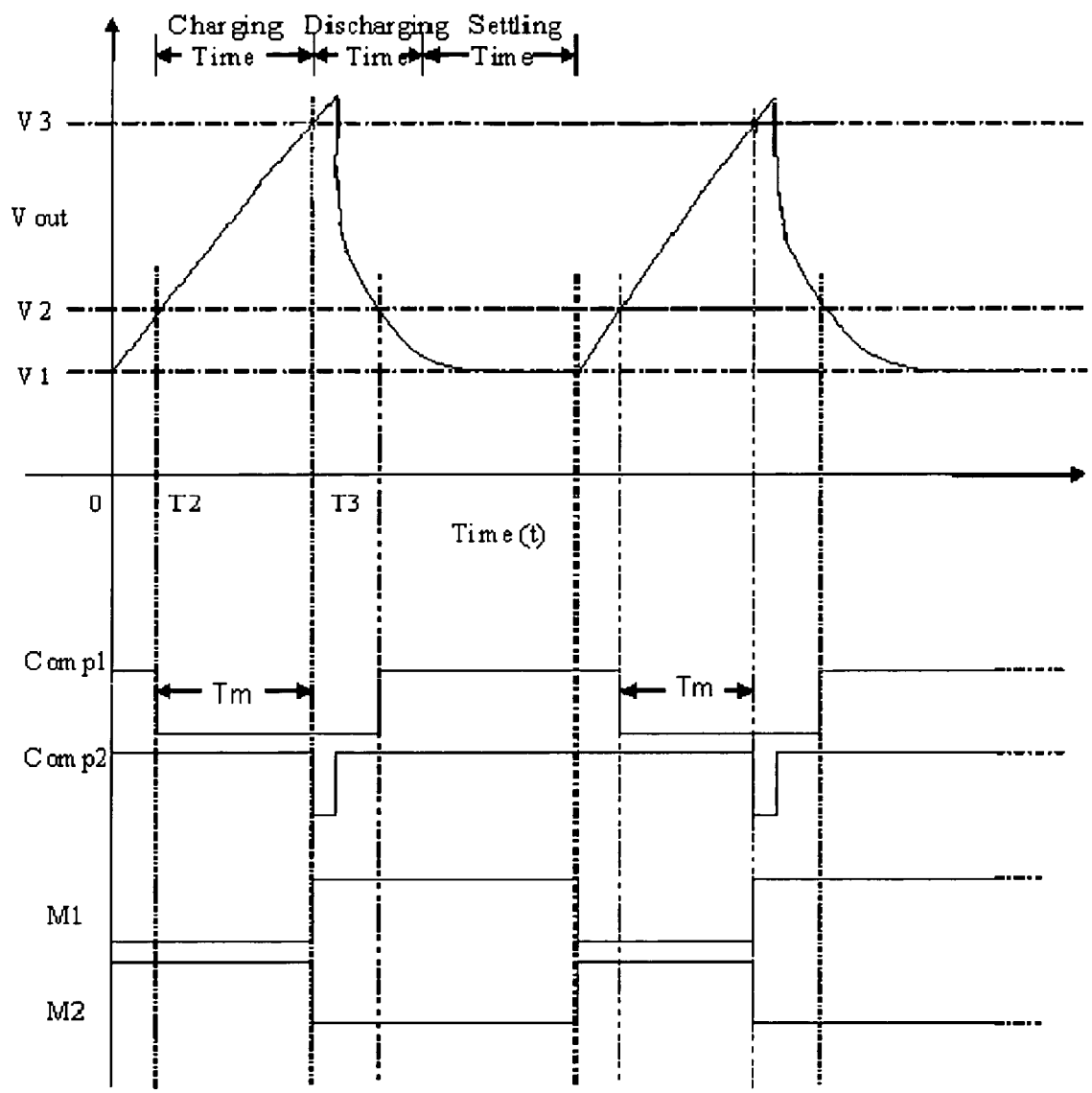
FIG. 2 illustrates the timing diagram and the status of the control signal for the circuit of FIG. 1.

FIG. 2 illustrates the proportionality between time elapsed of the differential input voltage in accordance with the status of the control signal M1 and M2. When Vout attains a value equal to V2 and V3, falling edges occur at the output of the comparators Comp1 and Comp2, respectively, and time is measured at these instants. This figure also illustrates the difference of these two readings as the reference to measure the polarity of the input voltage VIN.

The operation of the OPAMP circuit is further elaborated with the help the equations given below:

$$I=(V1-VIN)/R=C*dVc/dt \text{ (where } Vc=Vout-V1),$$

where current I is constant for a particular value of the input signal. (It is assumed that there is no noise present and the input offset voltage of the op-amp is negligible).

Applying Laplace transform:

$$(V1-VIN)/s*R=C*(s\ Vc(s)-Vc(0+)), \text{ or}$$

$$(V1-VIN)/s^2=(R*C)*(Vc(s)-Vc(0+)/s)$$

Applying the inverse Laplace transform, we get $$(V1-VIN)*T=(R*C)*(Vc(t)-Vc(0+)) \quad (1)$$

The above-obtained equation is the characteristics equation of the voltage to time converter OPAMP circuit. Using this equation we can measure both positive and negative voltages (with the polarity detection being done through software), wherein Vc(0+) that is the reset voltage across the charging capacitor still persists and is undesirable. Vc(0+) is a variable voltage which causes a source of error polarity detection and measurement. To eliminate this error, herein two comparators are used to improve the precision further.

Assuming that the time taken for Vout to increase from V1 to V2 and from V1 to V3 is T2 and T3, respectively, we obtain the following equations to establish a relation between the variation in the differential input voltage and the time elapsed:

At $T=T2;\ Vc(t)=V2-V1$

At $T=T3;\ Vc(t)=V3-V1$

Thus, we obtain the following set of equations:

$$(V1-VIN)*T2=(R*C)*(V2-V1-Vc(0+)) \quad (2)$$

$$(V1-VIN)*T3=(R*C)*(V3-V1-Vc(0+)) \quad (3)$$

Subtracting equation (3) from equation (2) we obtain the following equation:

$$(V1-VIN)*(T3-T2)=(R*C)*(V3-V2) \quad (4)$$

It is observed from equation (4) that factors comprising Vc(0+) are removed and accurate measurement is obtained by using additional comparators.

Rearranging equation (4) we obtain:

$$VIN=V1\{(R*C)/(T3-T2)\}*(V3-V2)$$

Let T3−T2=Tm then, $$VIN=V1-\{(R*C)*(V3-V2)\}/Tm \quad (5)$$

So using equation (2), we can measure the input voltage VIN based on the value TREF.

It is concluded from the above stated analysis that the voltage to time conversion takes place for the condition VIN≦V1, whereas if the input voltage is greater than V1 the direction of current I will be inverted and the capacitor will start charging in the opposite direction and conversion will never take place.

Figure 3:
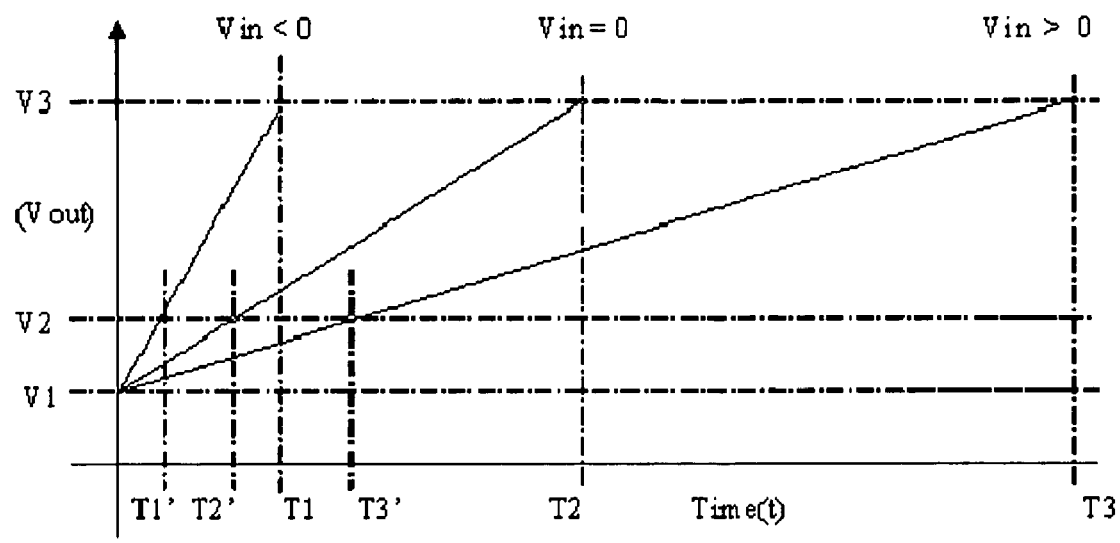
FIG. 3 illustrates the relationship between the output voltage and time for different input voltages.
Figure 4:
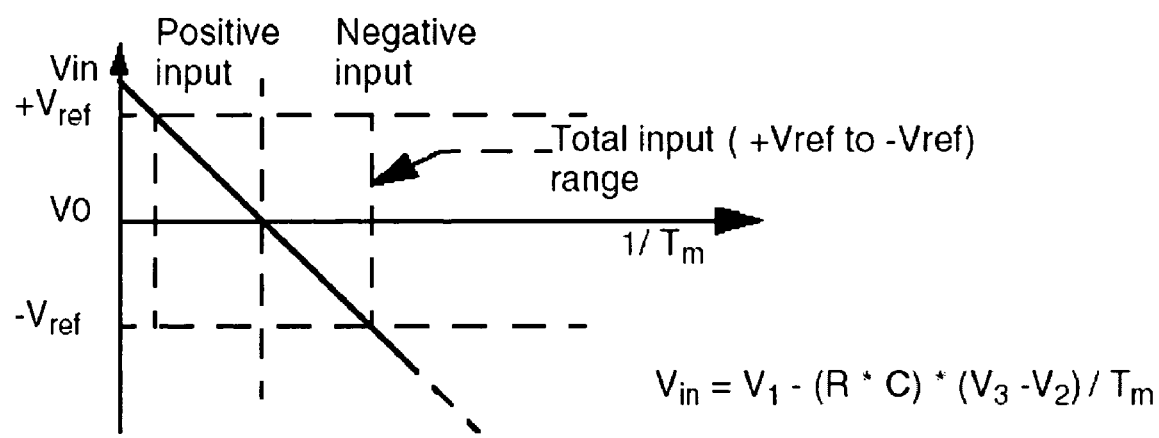
FIG. 4 illustrates the input voltage with respect to time.

FIG. 3 shows the relationship between Vout and Time for the different input voltages. For negative polarity input, current I that depends on the difference V1−VIN, which will be high, so that the charging time for negative voltages will be less than the positive voltages as shown in the above diagram.

An advantage of this converter is the ability to measure positive and negative input voltages operating from a single supply, while other slope converter in general require a dual supply. Also this converter does not require any negative voltage reference.

Figure 5:
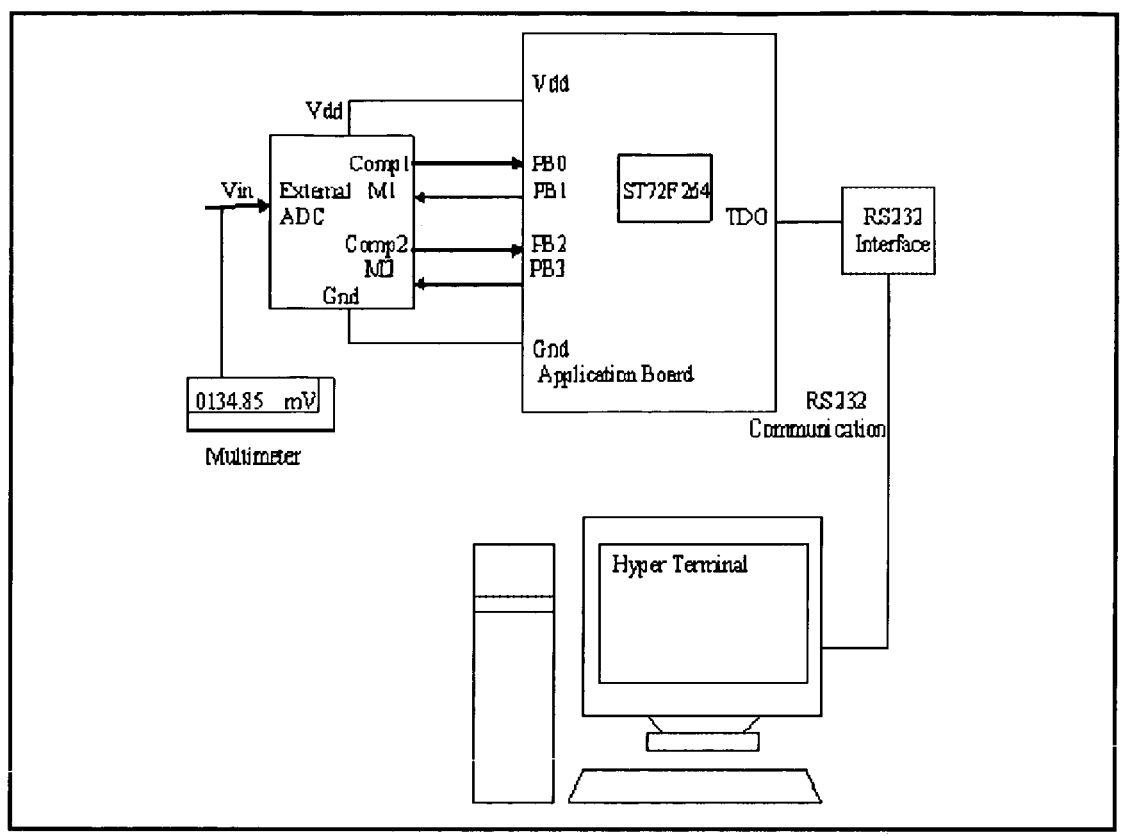
FIG. 5 illustrates an analog to digital conversion apparatus in accordance with an embodiment of the invention.

FIG. 5 illustrates an embodiment of the instant invention wherein the ADC is interfaced to the microcontroller (for example, ST72F264), wherein the ADC comprising the OPAMP integrator circuit as illustrated in FIG. 1. The inputs capture pins PB0 and PB2 are used for capturing the pulse from the two comparators (Comp1 and Comp 2) at two instants (when the output voltage Vout attains values equal to V2 and V3, respectively). Pins PB1 and PB3 are used for controlling the voltage at the gate of the M1 and M2 switches. The results of the ADC conversion are displayed on the Windows HyperTerminal application (Personal Computer or Laptop) through an RS232-SCI interface.

Figure 6:
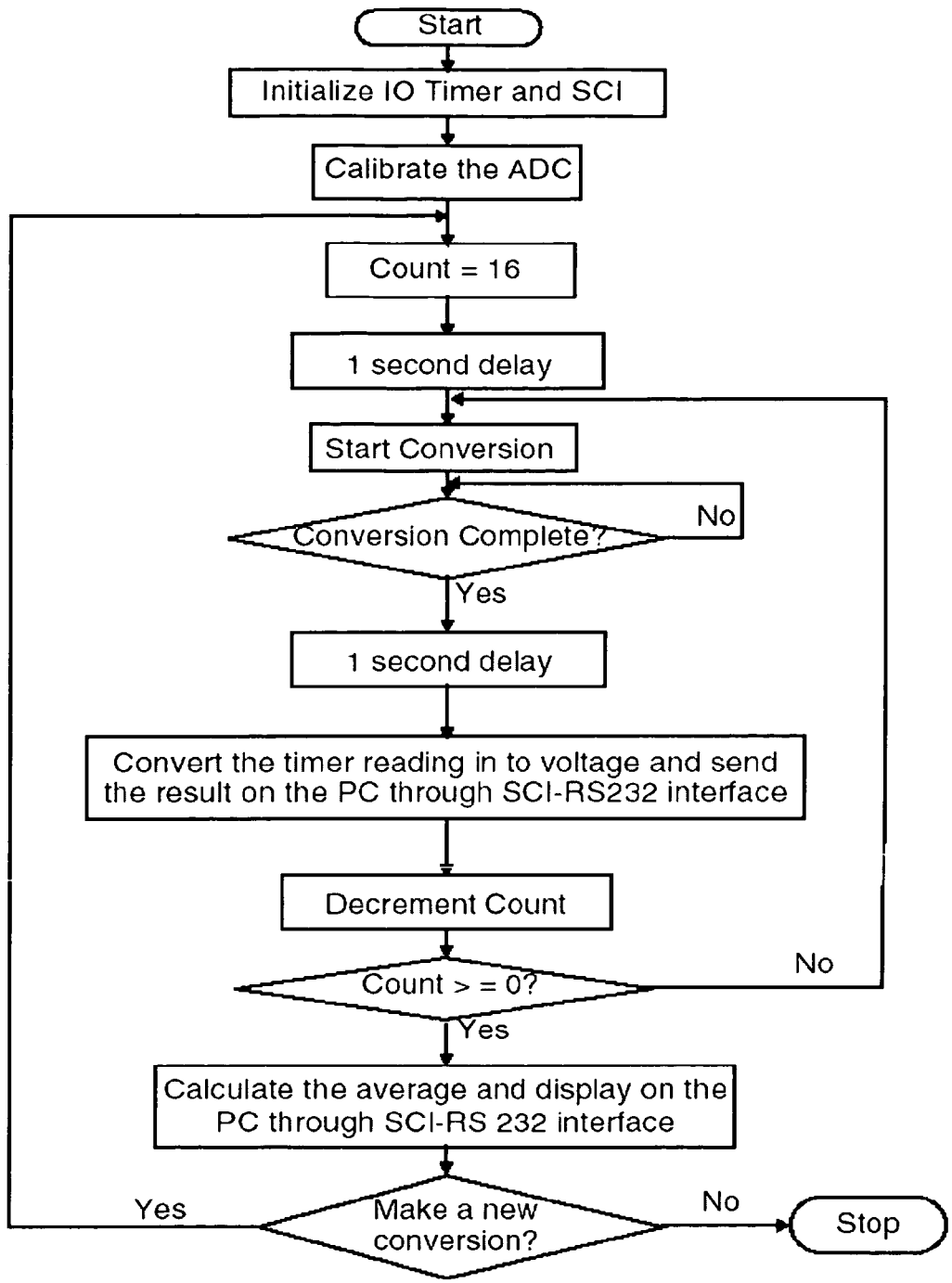
FIG. 6 illustrates the method for analog to digital conversion in accordance with an embodiment of the invention.

FIG. 6 illustrates the flow-diagram of the method for enabling the precision measurement of the input voltage polarity for the embodiment illustrated in FIG. 5. Herein, the method is enabled by the Input Output, Timer and the Serial Communication Interface (SCI) controls initialization. Analog-to-Digital conversion is further initialized in the flow diagram. Timer operation and indication of the SOC (Start Of Conversion), EOC (End Of Conversion), is illustrated further. Herein, conversion indicates conversion of an analog input signal to a digital value.

The method further comprises proportionate voltage generation and signal communication to SCI so as to display the results of the simulation on the PC or laptop. The down count functions for taking conversions for same input signals to indicate the deviation with respect to absolute and average input voltage signal values, and further verification for conversion of any applied input signal to the OPAMP circuit.

Table A illustrates the tabulated values of the input voltage signal and reference voltage and their relative error according to an exemplary implementation of the instant invention.

TABLE A

| SI no. | $V_{IN}$ (Taken from Multimeter) mV | Vmeasured (Avg of the 16 readings) mV | Difference (Vmeasured − Vin) (mV) | Error in Max and min input measured in the loop mV |
|---|---|---|---|---|
| Positive Voltage | | | | |
| 1 | 8.93 | 8.93 | 0 | 0.45 |
| 2 | 18.94 | 18.98 | 0.04 | 0.25 |
| 3 | 28.82 | 28.87 | 0.05 | 0.21 |
| 4 | 38.72 | 38.78 | 0.06 | 0.39 |
| 5 | 49.07 | 49.13 | 0.06 | 0.46 |
| 6 | 58.93 | 59.02 | 0.09 | 0.38 |
| 7 | 68.82 | 68.92 | 0.1 | 0.08 |
| 8 | 79.12 | 79.25 | 0.13 | 0.39 |
| 9 | 88.98 | 89.07 | 0.09 | 0.33 |
| 10 | 98.85 | 98.98 | 0.13 | 0.12 |
| 11 | 158.75 | 158.96 | 0.25 | 0.25 |
| 12 | 299.02 | 299.34 | 0.32 | 0.31 |
| 13 | 478.64 | 478.93 | 0.29 | 0.35 |
| 14 | 598.65 | 599.01 | 0.36 | 0.28 |
| 15 | 758.61 | 758.93 | 0.32 | 0.23 |
| 16 | 898.76 | 898.92 | 0.16 | 0.19 |
| 17 | 958.68 | 958.72 | 0.04 | 0.1 |
| 18 | 998.63 | 998.56 | −0.07 | 0.14 |
| Negative Voltage | | | | |
| 1 | −9.23 | −9.17 | 0.06 | 0.43 |
| 2 | −18.92 | −18.84 | 0.08 | 0.14 |
| 3 | −28.96 | −29.04 | −0.08 | 0.27 |
| 4 | −38.76 | −38.89 | −0.13 | 0.38 |
| 5 | −49.03 | −49.14 | −0.11 | 0.37 |
| 6 | −58.88 | −59 | −0.12 | 0.24 |
| 7 | −68.74 | −68.9 | −0.16 | 0.8 |
| 8 | −79.03 | −79.2 | −0.17 | 0.22 |
| 9 | −88.88 | −89.06 | −0.18 | 0.34 |
| 10 | −98.76 | −98.96 | −0.2 | 0.4 |
| 11 | −198.6 | −198.94 | −0.34 | 0.11 |
| 121 | −298.91 | −299.51 | −0.6 | 0.15 |
| 13 | −448.52 | −449.5 | −0.98 | 0.47 |
| 14 | −618.63 | −620.1 | −1.47 | 0.19 |
| 15 | −778.54 | −780.59 | −2.05 | 0.37 |
| 16 | −938.31 | −940.94 | −2.63 | 0.67 |

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An apparatus for polarity independent precision measurement of an input voltage signal comprising:
   voltage integrating means for receiving a first positive reference voltage at its first input and connected at its second input to said input voltage signal through a connecting means, said first positive reference voltage being greater in magnitude than said input voltage signal,
   resetting means coupled to said voltage integrating means for stabilizing the output of said voltage integrating means,
   a pair of comparators each having a first input terminal connected to the output of said voltage integrating means and having a second input terminal connected to a second reference voltage and a third reference voltage, respectively, said second and third reference voltages being greater in magnitude than said first reference voltage, and
   time interval measurement means having its two inputs connected to the outputs of said pair of comparators for measuring the time taken for the output of said voltage integrating means to transit between said second reference voltage level and said third reference voltage level, said time interval measurement means also providing complementary outputs for controlling said connecting means and for controlling said resetting means.

2. The apparatus as claimed in claim 1, wherein said voltage-integrating means comprises:
   an operational amplifier circuit,
   an integrating capacitor coupled between the inverting input and the output of said operational amplifier circuit for integrating said input voltage,
   a resistor coupled in parallel to said integrating capacitor, and
   a diode coupled between the non-inverting input and the output of said operational amplifier circuit and connected to the common node of said integrating capacitor and resistor for generating a controlled feedback signal.

3. The apparatus as claimed in claim 1, wherein said connecting means comprises a first transistor coupled in series to an input resistor.

4. The apparatus as claimed in claim 1, wherein said resetting means is a second transistor coupled in series to said resistor to form a feedback circuit.

5. The apparatus as claimed in claim 1, wherein said time interval measurement means is a micro controller or a programmable logic device.

6. A method for precision measurement of a polarity independent input voltage signal comprising steps of:
   integrating said input voltage signal to a first reference voltage and resetting the integrated output voltage to a value equal to said first reference voltage,
   integrating said integrated output voltage to second reference voltage and then to a third reference voltage,
   comparing the integrated output voltage with said second and third reference voltage, and
   measuring the time taken for the integration output to attain the value equal to said second and third reference voltage, and
   controlling the integration of the input voltage signal and resetting of the integrated output voltage.

7. A circuit, comprising:
   an integrator which operates to integrate an input voltage and generate an output voltage;
   a first comparator operable to compare the output voltage to a fixed positive first reference voltage and transition state in response thereto;
   a second comparator operable to compare the output voltage to a fixed positive second reference voltage and transition state in response thereto; and
   a time measurement circuit which measures an elapsed time between state transitions by the first and second comparators,
   wherein the time measurement circuit further operates responsive to completion of the elapsed time measurement to cause the integrator to stop integrating the input voltage and enter a discharge operational mode which sets the integrator output voltage to a fixed positive voltage.

8. The circuit of claim 7 wherein completion of the elapsed time measurement occurs responsive to a latter state transition of the first and second comparators, the time measurement circuit operating to reset the integrator output voltage the fixed positive voltage and disconnect the input voltage.

9. The circuit of claim 7 wherein the elapsed time measured by the time measurement circuit is indicative of whether the input voltage is positive or negative.

10. The circuit of claim 9 wherein a relatively shorter elapsed time indicates that input voltage is negative, and a relatively longer elapsed time indicates that input voltage is positive.

11. The circuit of claim 7 wherein the time measurement circuit is a microcontroller.

12. The circuit of claim 7 wherein the time measurement circuit further operates responsive to completion of the elapsed time measurement to disconnect the input voltage from the integrator.

13. The circuit of claim 7, the time measurement circuit comprising:
   a polarity characterization circuit operable on a unipolar signal indicative of measured elapsed time between state transitions to characterize the input voltage as being of either negative polarity or positive polarity.

14. The circuit of claim 13 wherein the polarity characterization circuit measures an integration rate of the unipolar signal, the integration rate being indicative of the input voltage signal having one of negative polarity or positive polarity.

15. The circuit of claim 14 wherein a relatively steep integration rate indicates a negative polarity and a less steep integration rate indicates a positive polarity.

16. The circuit of claim 14 wherein the polarity characterization circuit includes a microcontroller.

17. The circuit of claim 14 wherein the polarity characterization circuit does not convert polarity of the input voltage signal.

18. A method for identifying an input voltage of positive or negative polarity, comprising:
   integrating the input voltage to generate an output voltage;
   comparing the output voltage to a fixed positive first reference voltage so as to mark a first transition state in response thereto;
   compare the output voltage to a fixed positive second reference voltage so as to mark a second transition state in response thereto;
   measuring an elapsed time between the first and second marked transition states;
   characterizing the input voltage as negative for elapsed times less than a certain threshold and positive for elapsed times greater that the certain threshold;
   responding to a latter one of the first/second marked transition states by: stopping integration of the input voltage and resetting the output voltage from integration to a fixed positive voltage.

19. A method for precision measurement of a polarity independent input voltage signal comprising steps of:
   integrating said input voltage signal with respect to a first reference voltage and resetting the integrated output voltage to a value equal to said first reference voltage,
   comparing said integrated output voltage to a second reference voltage and generating a first comparison output,
   comparing said integrated output voltage to a third reference voltage and generating a second comparison output, and
   measuring based on the first and second comparison outputs a time taken for the integration output to attain the value equal to each of said second and third reference voltages, and
   controlling the integration of the input voltage signal and resetting of the integrated output voltage.

20. A circuit, comprising:
   an integrator which operates to integrate an input voltage in comparison to a first fixed reference voltage and generate an output voltage;
   a first comparator operable to compare the output voltage to a fixed second reference voltage and transition state in response thereto;
   a second comparator operable to compare the output voltage to a fixed third reference voltage and transition state in response thereto; and
   a time measurement circuit which measures an elapsed time with respect to state transitions of the first and second comparators, and responsive to a latter one of said state transitions causes the integrator to be reset with the output voltage to a value equal to the first fixed reference voltage.

* * * * *

UNITED STATES PATENT AND TRADEMARK OFFICE
CERTIFICATE OF CORRECTION

PATENT NO. : 7,336,213 B2
APPLICATION NO. : 11/305328
DATED : February 26, 2008
INVENTOR(S) : Nikhil Gupta et al.

It is certified that error appears in the above-identified patent and that said Letters Patent is hereby corrected as shown below:

In the Specification:

At column 3, line number 19, please replace the word [opamp] with the word -- op-amp --.

In the Claims:

At column 7, claim number 8, line number 23, please replace the phrase [voltage the fixed positive] with the following phrase -- voltage to the fixed positive --.

At column 8, claim number 20, line numbers 52-53, please replace the phrase [integrator to be reset with the output voltage] with the following phrase -- integrator to reset the output voltage --.

Signed and Sealed this
Thirteenth Day of September, 2011

David J. Kappos
*Director of the United States Patent and Trademark Office*